(12) United States Patent
Schunemann et al.

(10) Patent No.: US 10,156,023 B2
(45) Date of Patent: *Dec. 18, 2018

(54) ULTRA LONG LIFETIME GALLIUM ARSENIDE

(71) Applicant: BAE SYSTEMS INFORMATION AND ELECTRONIC SYSTEMS INTEGRATION INC., Nashua, NH (US)

(72) Inventors: Peter G. Schunemann, Hollis, NH (US); Kevin T. Zawilski, Arlington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/474,139

(22) Filed: Mar. 30, 2017

(65) Prior Publication Data

US 2017/0204533 A1   Jul. 20, 2017

Related U.S. Application Data

(63) Continuation-in-part of application No. 14/422,850, filed as application No. PCT/US2014/041932 on Jun. 11, 2014.

(Continued)

(51) Int. Cl.
*H01L 25/00* (2006.01)
*C30B 25/14* (2006.01)
(Continued)

(52) U.S. Cl.
CPC .............. *C30B 25/14* (2013.01); *C30B 25/12* (2013.01); *C30B 29/42* (2013.01); *H01L 31/0304* (2013.01)

(58) Field of Classification Search
None
See application file for complete search history.

(56) References Cited

U.S. PATENT DOCUMENTS

| 4,193,835 | A | 3/1980 | Inoue et al. |
| 5,471,948 | A | 12/1995 | Burroughes et al. |

(Continued)

OTHER PUBLICATIONS

Lynch, C., et al. "Thick orientation-patterned GaAs grown by low-pressure HVPE on fusion-bonded templates." Journal of Crystal Growth 353.1 (2012): 152-157.

(Continued)

*Primary Examiner* — Evren Seven
(74) *Attorney, Agent, or Firm* — Sand & Sebolt, LPA (57) ABSTRACT

A system and method for producing bulk GaAs with an increased carrier lifetime of at least 10 microseconds is provided. The system and method of producing the GaAs crystal involves using a technique called low pressure hydride vapor phase epitaxy (LP-HVPE). In this technique, a gas containing Ga (typically GaCl) is reacted with a gas containing As (typically $AsH_3$) at the surface of a GaAs substrate. When grown under the proper conditions, the epitaxial, vapor grown GaAs crystal has ultra-long free carrier lifetimes of at least one order of magnitude greater than that of the previous lifetime of 1 microsecond. This very long free carrier lifetime GaAs will be particularly useful as a semiconductor radiation detector material and is also expected to be useful for many other applications than include medical imaging, solar cells, diode lasers, and optical limiters and other applications.

19 Claims, 8 Drawing Sheets

Related U.S. Application Data (60) Provisional application No. 61/833,582, filed on Jun. 11, 2013.

(51) Int. Cl.
*H01L 31/0304* (2006.01)
*C30B 25/12* (2006.01)
*C30B 29/42* (2006.01)

(56) References Cited

U.S. PATENT DOCUMENTS

| | | |
|---|---|---|
| 6,483,134 B1 | 11/2002 | Weatherford et al. |
| 6,750,120 B1 | 6/2004 | Kneissl et al. |
| 7,112,545 B1 | 9/2006 | Railkar et al. |
| 2005/0233490 A1 | 10/2005 | Kasai et al. |
| 2007/0069302 A1 | 3/2007 | Jin et al. |
| 2008/0169483 A1 | 7/2008 | Kasai et al. |
| 2009/0001519 A1 | 1/2009 | Haskell et al. |
| 2010/0052105 A1 | 3/2010 | Henley et al. |
| 2011/0155049 A1 | 6/2011 | Solomon et al. |

OTHER PUBLICATIONS

Lynch, C., et al. "Characterization of HVPE-grown thick GaAs structures for IR and THz generation." Indium Phosphide and Related Materials Conference Proceedings, 2006 International Conference on. IEEE, 2006.

Molenkamp, L. W., et al. "Ultralong minority-carrier lifetimes in GaAs grown by low-pressure organometallic vapor phase epitaxy." Applied physics letters 54.20 (1989): 1992-1994.

Pütz, N., et al. "Low pressure vapor phase epitaxy of GaAs in a halogen transport system." Journal of The Electrochemical Society 128.10 (1981): 2202-2206.

Owens, Alan, and Anthony Peacock. "Compound semiconductor radiation detectors." Nuclear Instruments and Methods in Physics Research Section A: Accelerators, Spectrometers, Detectors and Associated Equipment 531.1 (2004): 18-37.

Ettenberg, M., G. H. Olsen, and C. J. Nuese. "Effect of gas-phase stoichiometry on the minority-carrier diffusion length in vapor-grown GaAs." Applied Physics Letters 29.3 (1976): 141-142.

Olsen, G. H., and T. J. Zamerowski. "Crystal growth and properties of binary, ternary and quaternary (In, Ga)(As, P) alloys grown by the hydride vapor phase epitaxy technique." Progress in crystal growth and characterization 2 (1981): 309-375.

European Search Report, EP 14810265.0, dated Nov. 8, 2016, 11 pages.

International Search Report, PCT/US2014/041932, dated Dec. 10, 2014, 6 pages.

McGregor, D. S., and H. Hermon. "Room-temperature compound semiconductor radiation detectors." Nuclear Instruments and Methods in Physics Research Section A: Accelerators, Spectrometers, Detectors and Associated Equipment 395.1 (1997): 101-124.

Sellin, P. J., et al. "Performance of semi-insulating gallium arsenide X-ray pixel detectors with current-integrating readout." Nuclear Instruments and Methods in Physics Research Section A: Accelerators, Spectrometers, Detectors and Associated Equipment 460.1 (2001): 207-212.

ULTRA LONG LIFETIME GALLIUM ARSENIDE

CROSS REFERENCE TO RELATED APPLICATION

This application is a continuation-in-part of application Ser. No. 14/422,850, filed Feb. 20, 2015, which is a national phase application of PCT Application No. PCT/US2014/041932, filed on Jun. 11, 2014, which claims the benefit of U.S. Provisional Application 61/833,582, filed on Jun. 11, 2013; the entirety of each is hereby incorporated by reference as if fully rewritten.

BACKGROUND

Technical Field

The current disclosure relates generally to a new embodiment of bulk GaAs with an increased carrier lifetime of at least 10 microseconds to be used for optical and electrical devices. The current disclosure also relates to the apparatus, systems, and methods for creating GaAs with very long free carrier lifetimes. More particularly, this very long free carrier lifetime GaAs is expected to be useful as a semiconductor radiation detector material, and also is expected to be useful for applications including, but not limited to, medical imaging, solar cells, diode lasers, and optical limiters.

Background Information

GaAs is a well-known semiconductor and is grown by many methods. It can be produced using a variety of techniques including both bulk melt growth and vapor growth. Commercially available GaAs always has a significant concentration of a defect called EL2 (As on Ga antisite defects) which are known to greatly reduce the free-carrier lifetime of the material. The EL2 antisite defects form deep level traps and are inherent in any melt grown material due to a widening of the solubility curve of As in GaAs as the GaAs crystal temperature is near that of the melting point of the compound.

Crystal growth from the vapor phase can be done at a temperature significantly lower than that of the melting point of the compound, however, most vapor growth techniques such as metal organic chemical vapor deposition (MOCVD) and molecular beam epitaxy (MBE) have growth rates that are much too slow (approximately 1 micron per hour) to make growth of any material approaching that of bulk quantities (>100 micrometers) practical.

GaAs with lower concentrations of EL2 defects or longer free carrier lifetimes would be useful because the electrons generated in a process like the absorption of radiation would be able to travel further distances through the GaAs before being trapped by a defect.

One area where longer lifetime (low EL2 defect) bulk GaAs is expected to be useful is in the manufacture of semiconductor radiation detectors. Improving the energy resolution of gamma radiation detectors is among the most important science and technology objectives for national security applications since it enables the use of high-resolution energy spectroscopy to distinguish between the natural radioactive isotopes, medical or commercially used radioisotopes, and radioisotopes that pose a threat. Gamma radiation detectors must be very thick—on the order of several millimeters—because of the deep penetration of high energy gamma rays which must be fully absorbed for accurate quantitative detection.

Of the two primary classes of radiation detector materials—semiconductors and scintillators—semiconductors are fundamentally capable of much higher energy resolution because the information carriers are the electrons and holes directly produced by the energy cascade. Desirable properties in such a semiconductor are a room temperature operation—which requires a band gap between 1.35-2.55 eV (McGregor and Hermon, Nuclear Instruments and Methods in Physics Research Section A: Accelerators, Spectrometers, Detectors and Associated Equipment Volume 395, Issue 1, Room-temperature compound semiconductor radiation detectors, pages 101-124 (1997), high electron and hole mobilities ($\mu$), and long carrier lifetimes ($\tau$). Historically, however, semiconductor radiation detectors have been limited by high cost, operational complexity, low efficiency due to limited size, and difficulty achieving high-purity, defect-free crystals. Unfortunately, progress in overcoming these obstacles over the years has been slow and incremental.

Progress in the development of high resolution, room temperature, gamma radiation detectors has been severely limited for many years by the size, quality, and transport properties of single crystal compound semiconductors. $Cd_xZn_{1-x}Te$ (CZT) is the most commercially advanced of these materials, but Te inclusions, twins, and grain boundaries are constant barriers to the size, yield, and cost of these crystals for detector applications.

Gallium arsenide (GaAs) has been studied as a radiation detector since the early 1960's, predating CZT, but its widespread use for gamma ray detection has never been realized due to the presence of native deep level traps (EL2, i.e., AsGa antisites) which reduced its free carrier lifetime at room temperature. Otherwise, GaAs has very attractive intrinsic properties. Its band gap of 1.42 electron voltage (eV) is near optimum. Theory predicts that carrier lifetimes in very pure and well-ordered GaAs should approach 100 microseconds or more, but such long lifetimes have never historically been observed.

A need exists, therefore, for bulk GaAs with free-carrier lifetimes significantly greater than that of the previous state of the art of 1 microsecond.

SUMMARY

One aspect of an embodiment of the present disclosure relates generally to a new embodiment of bulk GaAs with an increased carrier lifetime of at least 10 microseconds to be used for optical and electrical devices. Another aspect of an embodiment of the present disclosure includes a method for growing gallium arsenide (GaAs) to produce material with ultra-long free carrier lifetimes (>10 microseconds). The method involves using a technique called low pressure hydride vapor phase epitaxy (LP-HVPE). In this technique, GaCl gas is reacted with $AsH_3$ gas at the surface of a GaAs substrate. An epitaxial, high quality, vapor grown GaAs crystal is grown on top of the lower quality GaAs substrate in this manner. The epitaxial, vapor grown crystal is the material possessing the ultra-long free carrier lifetimes.

This very long free carrier lifetime GaAs is expected to be particularly useful as a semiconductor radiation detector material. GaAs produced through this method is also expected to be useful for applications including, but not limited to, medical imaging, solar cells, diode lasers, and optical limiters.

In accordance with one exemplary aspect, an embodiment of the present disclosure may provide a system and method for producing bulk GaAs with an increased carrier lifetime of at least 10 microseconds. The system and method of producing the GaAs crystal involves using a technique called low pressure hydride vapor phase epitaxy (LP- HVPE). In this technique, a gas containing Ga (typically GaCl) is reacted with a gas containing As (typically AsH3) at the surface of a GaAs substrate. When grown under the proper conditions, the epitaxial, vapor grown GaAs crystal has ultra-long free carrier lifetimes of at least one order of magnitude greater than that of the previous art of 1 microsecond. This very long free carrier lifetime GaAs will be particularly useful as a semiconductor radiation detector material and is also expected to be useful for many other applications that include medical imaging, solar cells, diode lasers, and optical limiters and other applications.

In accordance with another exemplary aspect, an embodiment of the present disclosure may provide a low pressure hydride vapor phase epitaxy (HVPE) system for forming GaAs having a carrier lifetime greater than 10 microseconds, the system comprising: a low pressure HVPE chamber; an arsenic (As) source in communication with the low pressure HVPE chamber; a gallium (Ga) source in communication with the low pressure HVPE chamber; a reaction of the As- and Ga-containing compounds within the low pressure HVPE chamber directly at a wafer surface forming a resultant bulk GaAs layer positioned, wherein the resultant bulk GaAs layer has a carrier lifetime greater than 10 microseconds.

In accordance with another exemplary aspect, an embodiment of the present disclosure may provide a method of forming bulk GaAs having a carrier lifetime of at least 10 microseconds comprising: providing a low-pressure hydride vapor phase epitaxy (HVPE) system including a reaction chamber; providing an arsine source; providing a gallium chloride source; delivering arsine (AsH3) from the arsine source to a substrate inside the reaction chamber; delivering gallium chloride (GaCl) from the gallium chloride source to the substrate; and mixing and effecting the reaction of the gallium chloride with the arsine directly at the substrate surface to create GaAs having a carrier lifetime of at least 10 microseconds.

In accordance with yet another aspect, an embodiment of the present disclosure may provide a method of forming bulk GaAs having a carrier lifetime of at least 10 microseconds comprising: providing a low-pressure hydride vapor phase epitaxy (HVPE) system including a reaction chamber; providing an arsine source; providing a gallium chloride source; delivering arsine (AsH3) from the arsine source to a substrate inside the reaction chamber; delivering gallium chloride (GaCl) from the gallium chloride source to the substrate; and mixing and effecting the reaction of the gallium chloride with the arsine directly at the substrate surface to create GaAs having a carrier lifetime of at least 10 microseconds. This embodiment or another embodiment may further provide wherein the substrate is an off-cut semiconductor substrate wafer, wherein an off-cut angle, relative to a primary crystallographic axis is greater than 1°. This embodiment or another embodiment may further provide precluding growth of parasitic Gallium Arsenide (GaAs) deposits on chamber walls of the low pressure HVPE system through direct delivery of arsine and gallium chloride to the substrate surface in a close-couple showerhead apparatus. This embodiment or another embodiment may further provide minimizing the incorporation of Silicon (Si) and Oxygen (O) impurities to effectuate the long carrier lifetimes. This embodiment or another embodiment may further provide precluding flow of hydrogen chloride (HCl) along silicon dioxide (SiO2) chamber walls of the low pressure HVPE system. This embodiment or another embodiment may further provide replacing silicon dioxide (SiO2) with Pyrolytic Boron Nitride (PBN) in a main reaction zone of the reaction chamber of the low pressure HVPE system. This embodiment or another embodiment may further provide wherein a close-couple shower-head apparatus delivering the arsine or gallium chloride to the substrate surface is fabricated from PBN. This embodiment or another embodiment may further provide wherein a susceptor is covered by PBN. This embodiment or another embodiment may further provide rotating a satellite disc that supports a wafer holder and wafer from below, wherein the wafer holder is fabricated from PBN. This embodiment or another embodiment may further provide providing a recessed horizontal wafer holder. This embodiment or another embodiment may further provide wherein the recessed horizontal holder reduces back-side impurity vapor transport from the substrate. This embodiment or another embodiment may further provide rotating the substrate, wherein the substrate is rotated during GaAs growth. This embodiment or another embodiment may further provide, wherein the wafer is rotated to enhance mixing of the reacting GaCl and AsH3 gases. This embodiment or another embodiment may further provide, wherein the wafer is rotated to achieve bulk GaAs with uniform composition and thickness. This embodiment or another embodiment may further provide, wherein the wafer is rotated by flowing inert gas over grooves on the underside of the satellite disc that supports the wafer.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the present disclosure. The accompanying drawings, which are incorporated in and constitute a part of the specification, illustrate various example methods, and other example embodiments of various aspects of the present disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

In accordance with an aspect of the present disclosure, an exemplary embodiment provides a new GaAs with an increased carrier lifetime of at least 10 microseconds that can be used for optical devices, electrical devices and other devices. One particular embodiment of a new GaAs is created using a known, but little-used, method of vapor growth of semiconductor crystals, low pressure hydride vapor phase epitaxy (LP-HVPE), to produce GaAs with the unique properties of having ultra-long free carrier lifetimes. This method of fabricating the preferred embodiment of a new GaAs crystal significantly advances the state of the art of semiconductor materials for multiple applications, including high resolution radiation detectors, dramatically improves the material quality, and is scalable to production of large quantities and aperture sizes.

Data supporting the increased free-carrier lifetime of GaAs grown in the LP-HVPE reactor include optical transmission spectral data, two photon non-linear absorption data, microwave-photoconductive decay (p-PCD) data, and photoconductive decay (PCD) data.

Figure 1:
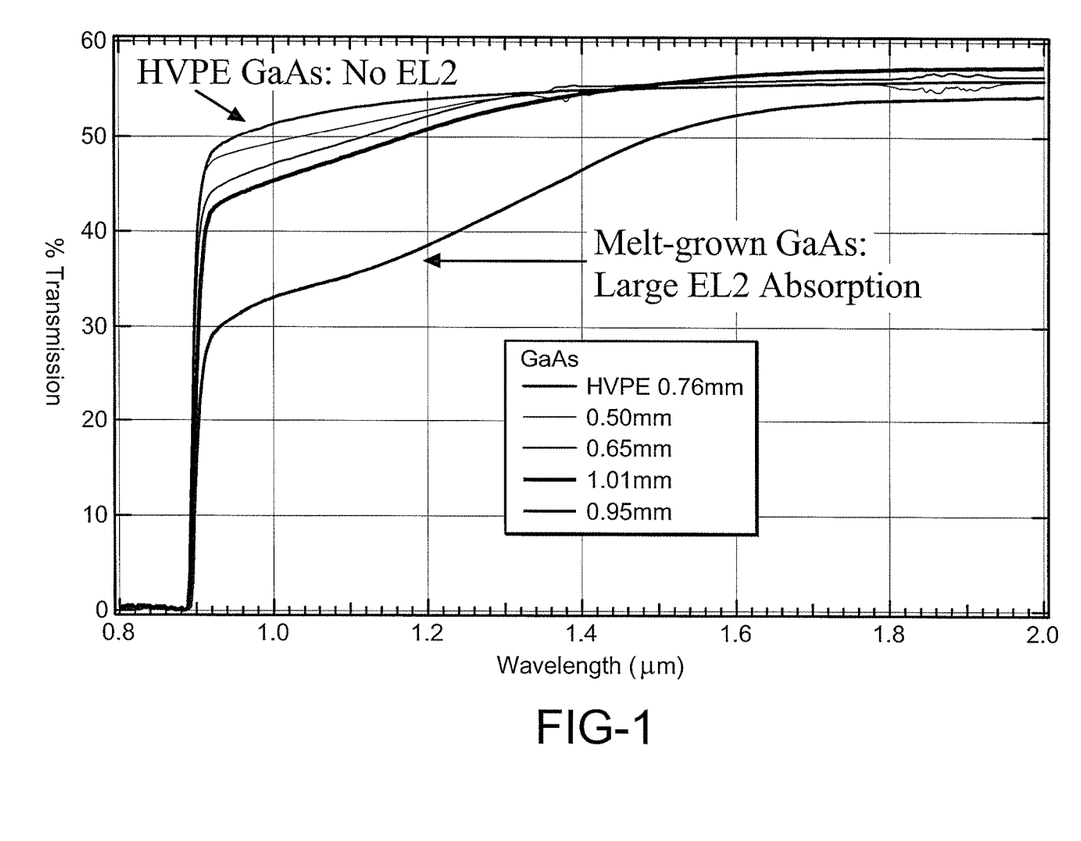
FIG. 1 shows optical transmission spectra of various GaAs samples near the band edge and that the HVPE GaAs is the only sample with substantially no absorption as the wavelength approaches the band edge.

Spectral transmission data comparing the novel embodiment HVPE GaAs to traditional melt-grown crystals shows that the HVPE GaAs is free of any near-band edge absorption whereas the melt-grown GaAs samples exhibit a broad absorption shoulder that extends from the band edge to 1.3 um and beyond due to a high concentration of EL2 (AsGa) defects which are known to kill the carrier lifetime in GaAs radiation detectors (P. J. Sellin et al., *Nuclear Instruments and Methods in Physics Research A* 460, 207-212, 2001—*Performance of semi-insulating gallium arsenide X-ray pixel detectors with current-integrating readout*). FIG. 1 shows the optical absorption spectra of various types of GaAs. Note that the HVPE GaAs with little/no EL2 does not show any absorption until the bandedge (~0.9 microns) while the other prior GaAs samples all have varying degrees of absorption (attributable to the EL2 defect) from 0.9 microns to 1.2 microns and beyond.

Figure 2:
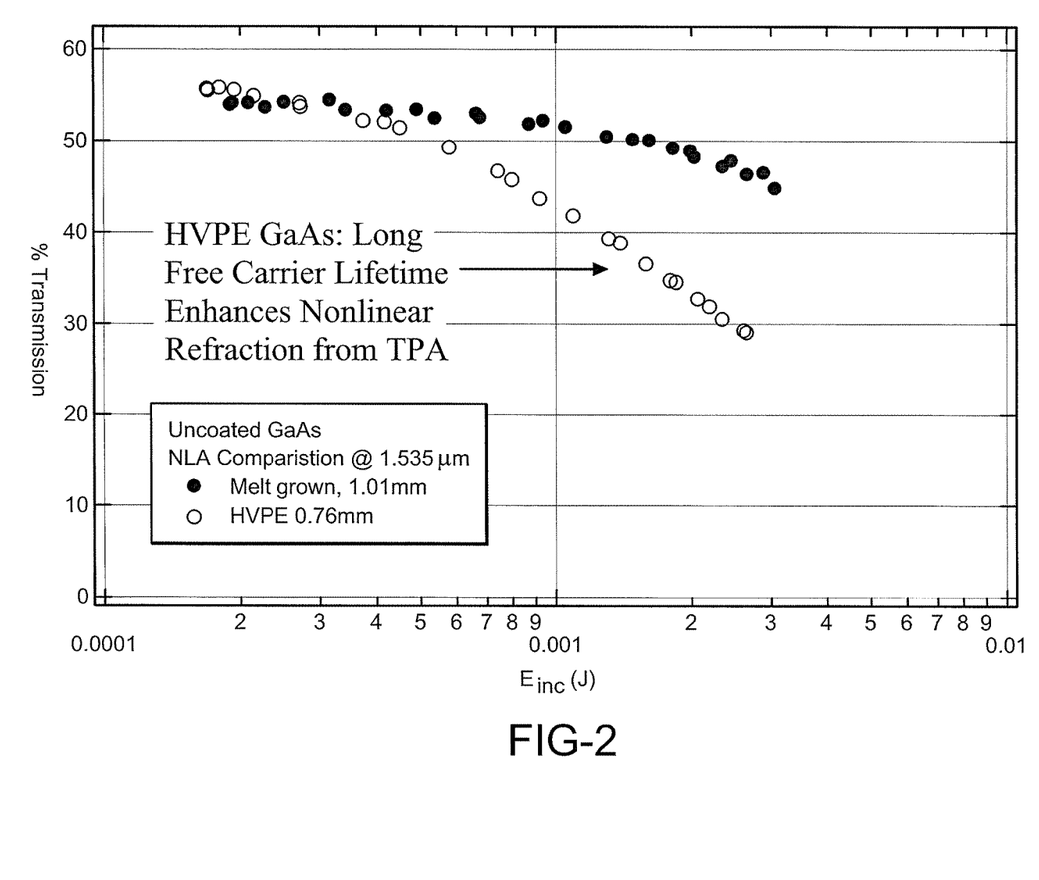
FIG. 2 shows non-linear absorption plots for melt grown and HVPE grown GaAs and that HVPE GaAs has significantly improved non-linear absorption compared to the melt grown sample.

When two-photon absorption at 1064 nm was measured by the inventors for unpatterned LP-HVPE-grown GaAs samples, the nonlinear absorption and self-focusing were found to be much stronger than observed in typical melt-grown GaAs. This stronger than normal non-linear absorption and can be seen in FIG. 2. This non-linear absorption and self-focusing were attributed to longer free-carrier lifetimes than those found in typical GaAs when the non-linear absorption data was combined with the optical absorption data as shown in FIG. 1.

Figure 3A:
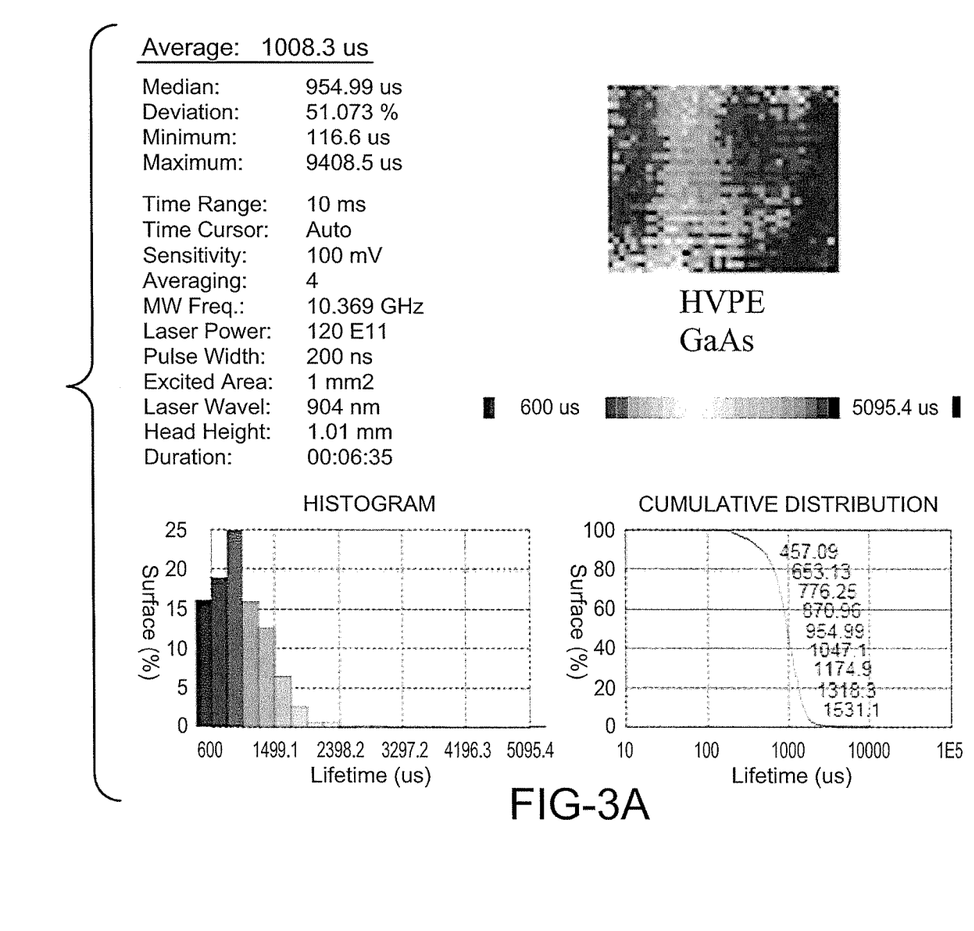
FIG. 3A and FIG. 3B shows graphs taken by the inventors that show average carrier lifetimes of greater than 1000 μs the inventor's high quality HVPE GaAs wafers versus 0.275 μs in prior art commercial grade GaAs.
Figure 3B:
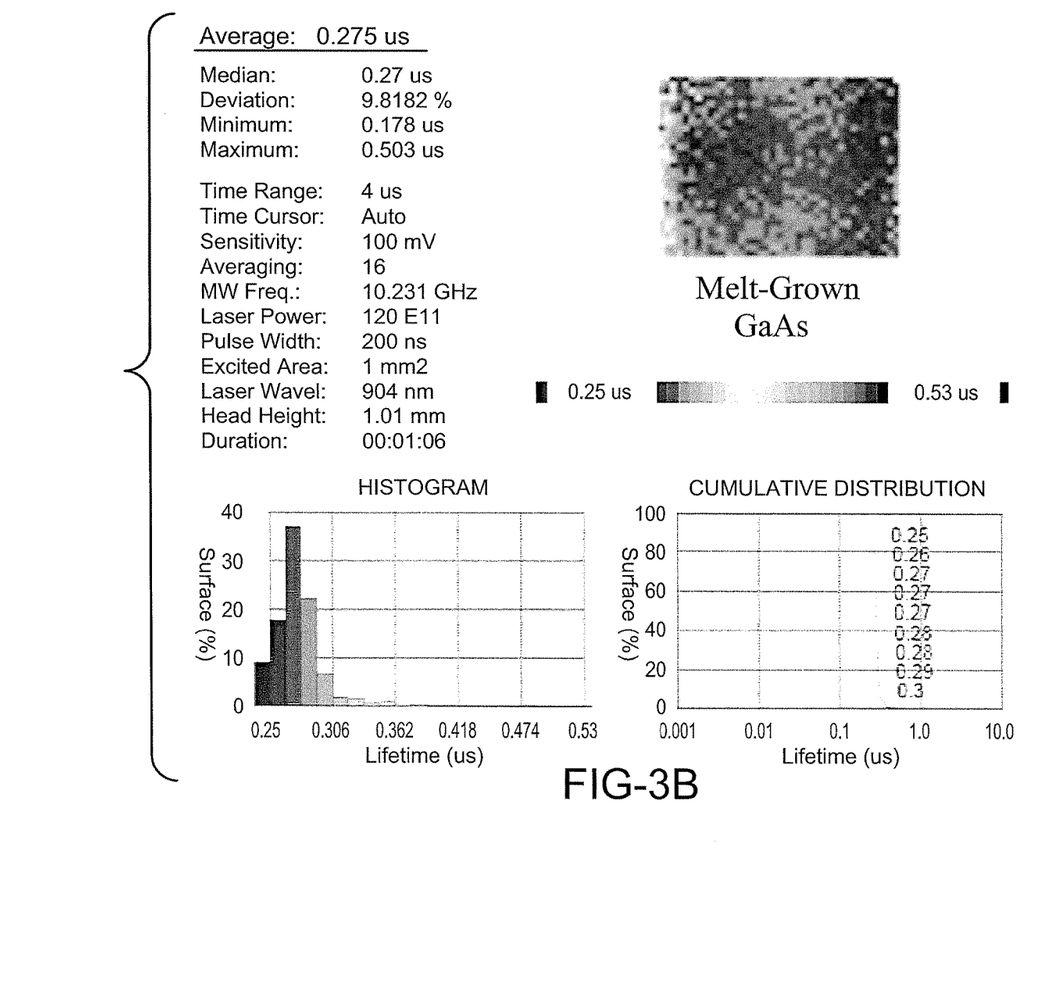

Quantitative lifetime measurements were performed using a Semilab WT-2000 microwave photoconductive decay (pPCD) wafer test system in which free carriers are generated by illumination with a 904-nm, 200-ns laser and the lifetime is measured via changes in the reflectivity of 10 GHz microwave radiation. The results are shown in the graphs of FIG. 3, indicating average carrier lifetimes >1000 microseconds(ps) in the high quality HVPE GaAs wafers of one embodiment versus 0.275 ps in commercial melt-grown GaAs: an improvement of 3-4 orders of magnitude. These measured lifetimes are approximately 3 orders of magnitude longer than the best known prior GaAs ever measured as of Jun. 11, 2013.

To verify these lifetime values, the inventors performed a photoconductive decay experiment using a 532 nm pulsed laser (12-ns, 12-mJ, 5 Hz) to fully illuminate an 8×8×0.5 mm$^3$ LP-HVPE GaAs sample (substrate removed) with a voltage of 6V DC applied across ohmic contacts deposited on opposite edges. The resulting signal was measured with an oscilloscope, and the results were fit to an exponential decay which yielded decay times in the range of 50-100 μs compared to 1000 μs measured by μPCD on the same sample (see the right hand cumulative distribution graphs in FIG. 3A and 3B). These values are lower than the values measured through μPCD, but are still 100 times better than the best GaAs reported previously.

The reason for these improvements is fundamental to the growth technique—the concentration of defects that can act as traps is reduced by orders of magnitude because 1) extremely high purities can be achieved from the gas phase and 2) the width of the solid solubility range—and hence the concentration of native stoichiometric defects—is near zero at growth temperatures (680° C. for GaAs) that are hundreds of degrees below the melting point (1240° C. for GaAs).

Figure 4:
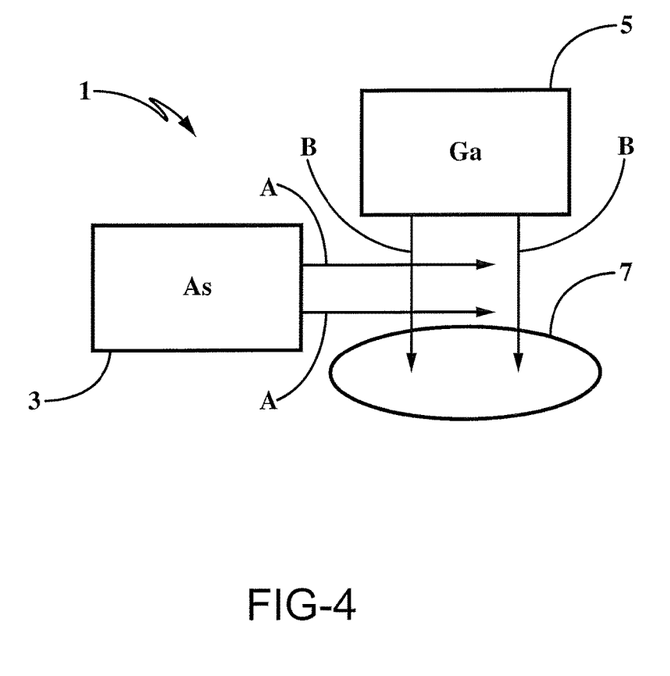
FIG. 4 illustrates one embodiment of a system used to grow a GaAs crystal using a hydride vapor phase epitaxy (HVPE) process.

FIG. 4 illustrates one embodiment of a hydride vapor phase epitaxy (HVPE) system 1 use to grow GaAs crystals. The HVPE system 1 includes an arsenide source device 3 and a gallium source device 5 and a material 7 onto which it is desired to grow GaAs crystal(s). In one embodiment, the material 7 where the crystals are grown is a GaAs wafer but it can be other materials. In one further embodiment, the As source device 3 is an AsH$_3$ source and the Ga source device 5 is a GaCl source. These two source devices 3, 5 deliver GaCl and AsH$_3$ in a vapor form where they react to form GaAs at the surface of the material 7 onto which the GaAs crystal is to be grown. As illustrated, the Ga source device 5 is adapted to deliver the Ga compound in a downward vertical direction as indicated by arrow B and the As compound source 3 is adapted to deliver the As compound in a horizontal direction as indicated by arrow A. While illustrated as vertical and horizontal, in a further example the Ga source 5 is delivered toward the material 7 and the As source 3 is orthogonal to the direction of the Ga source 5.

Having described the components of the HVPE system 1, its use and operation are now described. In operation, the As source device 3 injects AsH$_3$ gas in the direction of arrows A above the surface of the material 7 onto which GaAs crystal are to be grown. The Ga source device 5 injects the GaCl gas in a downward direction as illustrated by arrows B. In some embodiments, a chlorine transport agent such as HCl, flowing in the presence of a carrier gas (H$_2$) over a metallic Ga source, can be used to form the GaCl in the gallium source device 5. As the AsH$_3$ and GaCl travel in the directions of arrows A and B respectively they react to form GaAs at the surface of the material 7. This reaction takes place according to the equation GaCl+AsH$_3$⇒GaAs+HCl+H$_2$, One key feature of this technique is that the use of a chloride precursor (as opposed to the metal organics used in MOCVD) allows deposition to take place under near-equilibrium conditions.

The HVPE system 1 uses a novel growth technique that overcomes many of the obstacles inherent in melt growth of compound semiconductors. In particular, crystal growth from the vapor phase minimizes the concentration of native stoichiometric defects by deposition at temperatures well below the melting point. The HVPE system 1 produces compound semiconductor GaAs that has increased free carrier lifetime than prior art semiconductor GaAs. The HVPE system 1 also solves the problem of the prior art which was characterized by low free carrier lifetimes for GaAs by eliminating native defects which trap free carriers, particularly As-on-Ga antisite (EL2) defects.

Figure 5A:
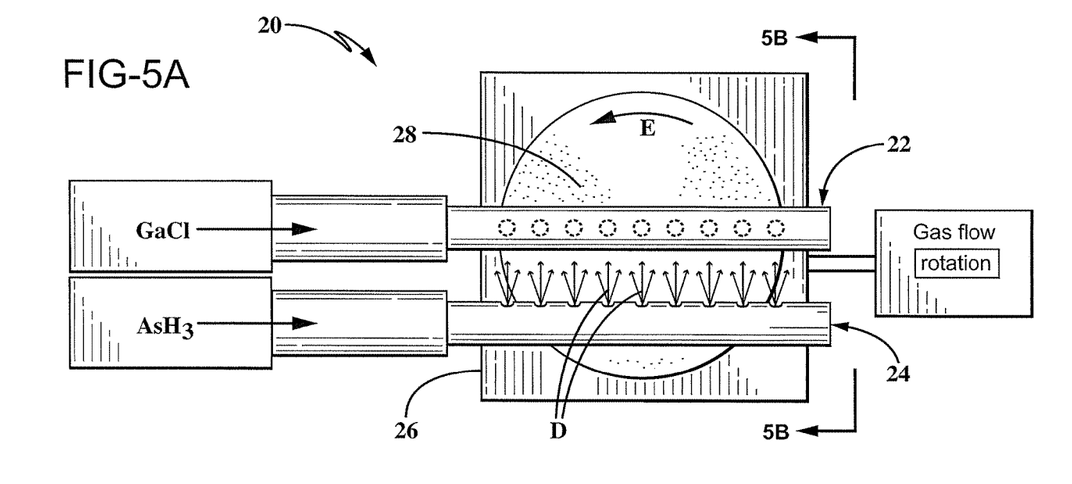
FIG. 5A depicts a top view of a HVPE reactor design for thick-film growth of GaAs.
Figure 5B:
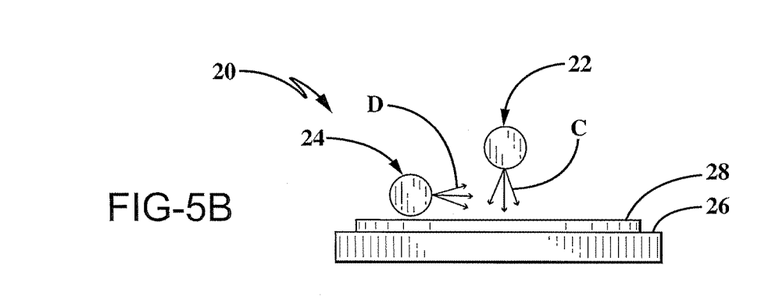
FIG. 5B depicts an end view of the HVPE reactor design of FIG. 5A.

FIG. 5A and FIG. 5B illustrate another embodiment of an HVPE system 20 for creating GaAs products. This system 20 includes GaCl delivery piping 22 and $AsH_3$ delivery piping 24. A table 26 supports a wafer 28. The GaCl delivery piping 22 can be cylindrical in shape with round openings above where a wafer 28 is mounted. The openings are adapted to deliver GaCl downward from the piping 22 in the direction of arrows C onto the wafer 28. Similarly, the $AsH_3$ piping 24 is cylindrical in shape and has small openings to deliver $AsH_3$ horizontally in the direction of arrows D just above the wafer 28. Of course, those of ordinary skill in the art will appreciated other ways of delivering GaCl and $AsH_3$ to the wafer 28.

Typical growth conditions in the LP-HVPE reactor that produce GaAs with ultra long free carrier lifetimes are listed below. A reactor operating pressure of <100 mbar and a substrate temperature in the range of 680-710 C are used. Typical $AsH_3$ gas flow rates are in the range of 120-240 sccm. Typical GaCl flow rates are in the range of 75-90 sccm. The V/III ratio or the ratio of As to Ga flow rates is in the range of 1-3. Growth rates of GaAs under these conditions range from 85-200 micrometers/hr. Film thicknesses of >2.5 mm have been achieved under these conditions. Longer growth runs have the capability of increasing the thicknesses above 10 mm.

An example of specific LP-HVPE conditions producing GaAs with free carrier lifetimes >10 microseconds is listed below. A reactor operating pressure of 20 mbar was used in conjunction with a substrate temperature of 689.8 C. The $AsH_3$ flow rate was 120 sccm and the GaCl flow rate was 40 sccm which gives a V/III ratio of 3. Gases were reacted at the surface of a rotating GaAs substrate for 600 minutes, producing a vapor grown film with an average thickness of 1316 micrometers. The average growth rate of the vapor grown GaAs was 132 micrometers/hr during this growth run.

Those of ordinary skill in the art will appreciate that the embodiment LP-HVPE system 1 dramatically improves upon the prior systems by overcoming the limitations of melt growth and offering all of the same advantages of vapor growth: no segregation effects, ultra high purity, superior process control, in-situ diagnostics, scalability, etc. while also performing at growth rates approaching those used for bulk semiconductor growth from the melt (~200 pm/hour). This LP-HVPE system 1 significantly advances the state of the art of semiconductor materials for high resolution radiation detectors, dramatically improves the material quality, and is scalable to production of large quantities and aperture sizes. The novel LP-HVPE system 1 solves the problem of the prior art which was characterized by low free carrier lifetimes for GaAs by eliminating native defects which trap free carriers, particularly As-on-Ga antisite (EL2) defects, by using the novel LP-HVPE growth technique desribed above.

The very long lifetimes of GaAs (up to 10 milliseconds compared to ~1 microsecond in prior art GaAs) grown by the LP-HVPE system 1 could have a revolutionary impact on several applications such as radiation detectors, medical imaging, solar cells, diode lasers, and optical limiters. One of these potential applications, that of radiation detectors, is described in more detail below.

Table 1, shown below, lists the properties of traditional elemental (IV) and compound (II-VI and III-V) semiconductor materials used for radiation detector applications. Among these, high purity germanium (HPGe) and cadmium zinc telluride ($Cd_xZn_{1-x}Te$ or CZT) have received the most attention. HPGe has the best energy resolution of commonly used materials, however it requires cryogenic cooling to liquid nitrogen temperatures to function which excludes it from many national security applications. CZT operates at room temperature, but the single crystalline material is exceedingly difficult to grow and has issues with compositional uniformity, twinning, inclusions, etc. that adversely affect device performance.

TABLE 1

Properties of common semiconductor radiation materials.

| | Density (g/cm$^3$) | Band gap (eV) | Pair Creation energy (eV) | Electron mobility-lifetime product (cm$^2$V$^{-1}$s) | Hole mobility-lifetime |
|---|---|---|---|---|---|
| Si | 2.33 | 1.12 | 3.62 | >1 | ~1 |
| Ge | 5.33 | 0.67 | 2.96 | >1 | >1 |
| CdMnTe | 5.8 | 1.73 | 2.12 | >10$^{-6}$ | . . . |
| CdSe | 5.81 | 1.73 | 5.5 | 6.3 × 10$^{-5}$ | 7.5 × 10$^{-5}$ |
| CdTe | 5.85 | 1.44 | 4.43 | 3 × 10$^{-3}$ | 2 × 10$^{-4}$ |
| CdZnSe | 5.5 | 2.0 | 6.0 | ~10$^{-4}$ | 10$^{-6}$ |
| CdZnTe | 5.78 | 1.57 | 4.46 | 4 × 10$^{-3}$ | 1.2 × 10$^{-4}$ |
| GaAs | 5.32 | 1.43 | 4.2 | 8 × 10$^{-5}$ | 4 × 10$^{-6}$ |
| InP | 4.78 | 1.35 | 4.2 | 5 × 10$^{-6}$ | <1.6 × 10$^{-5}$ |

Gallium arsenide (GaAs) has properties similar to CZT, but its application has been limited by low carrier lifetimes (and hence a low mobility-lifetime product, pi) due to a high concentration of traps (specifically the defect known as EL2, which is an $As_{ia}$ anti-site). Otherwise, however, the size, quality, and cost of GaAs crystals are far superior to those of CZT. In particular, the band gap of GaAs of 1.42 electron voltage (eV) is near optimum for operation at room temperature. Traditional vapor growth techniques such as molecular beam epitaxy (MBE) and metal organic chemical vapor deposition (MOCVD) are characterized by extremely slow growth rates (~1 µm/hour) which are impractical for producing bulk devices like radiation detectors which are typically several millimeters thick.

The bulk GaAs produced through the LP-HVPE method with high free-carrier lifetimes therefore has the potential to make a large impact in the field of semiconductor radiation detectors by providing a material capable of high energy resolution that can operate at room temperature. These vapor grown crystals will be more reproducible and easier to grow (and hence cheaper) than those of CZT (the current preferred room temperature radiation detector material).

Figure 6:
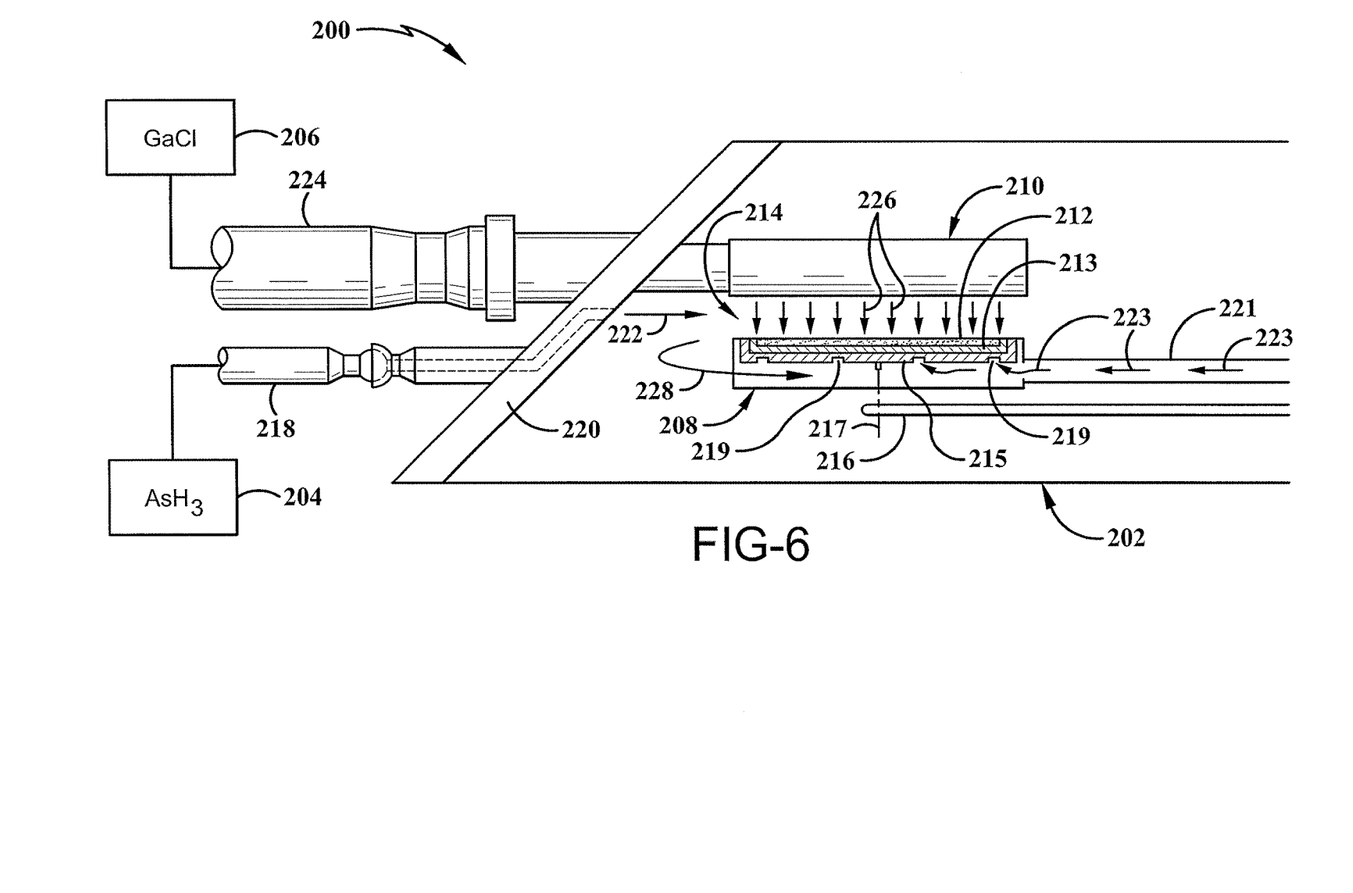
FIG. 6 is a side elevation view of a second embodiment low pressure HVPE system.

FIG. 6 depicts another exemplary embodiment of the present disclosure. This exemplary LP-HVPE system for creating GaAs products having long free carrier lifetimes is shown generally at 200. LP-HVPE system 200 includes a reaction chamber 202, an arsine source 204, a gallium chloride source 206, a susceptor 208, a close-couple showerhead apparatus 210, a bulk GaAs substrate or wafer 212, an orthogonal mixing region 214, and a thermocouple 216.

The arsine source 204 delivers $AsH_3$ through delivery piping 218 which expands such as in a triangular volume defined by a thick-walled end cap 220 and exits from a wide horizontal slot, resulting in a "sheet" of $AsH_3$ flowing horizontally over the substrate wafer 212, preferably GaAs, which is rotating as shown by the arrow 228. The horizontally flowing sheet of $AsH_3$ is indicated by arrow 222.

The gallium source 206 delivers GaCl through delivery piping 224. Piping 224 extends through the angled end cap 220 of the reaction chamber 202 into a "showerhead" injector with a plurality of outlets configured to disperse GaCl therethrough with a downward vertical flow. This downward vertical flow 226 of GaCl reacts with the horizontal flowing sheet of $AsH_3$ 222 to form GaAs directly at the surface of the wafer according to the reaction $GaCl + AsH_3 \rightarrow GaAs + HCl + H_2$. The delivery piping 224 forms a portion of the closely coupled showerhead apparatus 210. There may be two tubes of delivery piping 224 (wherein one of the tubes is not shown in the side elevation view of FIG. 6 because it is positioned behind the foreground tube). The shower head injector is part of the close-couple showerhead apparatus 210. Thermocouple 216 is located directly below the susceptor to give an accurate measure of the substrate temperature during growth of bulk GaAs. In one particular embodiment, the substrate temperature is between 680° C. and 710° C. to achieve long free carrier lifetimes.

The susceptor 208 is mounted on the end of a support tube 221 within the reaction chamber. The susceptor 208 is recessed and holds a satellite disc 215 on which the wafer holder 213 and semiconductor substrate wafer 212 rest. The substrate wafer 212 is supported by the holder 213. In one particular embodiment, the substrate wafer 212 is concentric with the holder 213. The satellite disc 215 rests on and rotates about an axis 217 via a pin or other mechanism to enable rotation about axis 217. The rotation is driven by inert gas 223 which flows through the support tube 221 over grooves 219 formed on the underside of the satellite disc 215 whereby the rotation rate is controlled by the rate of inert gas flow 223. The rotation of satellite disc 215 carrying the holder 213 which carries the substrate wafer 212 is indicated by arrow 228.

System 200 offers exemplary design features that are helpful to the realization of bulk GaAs with ultra-long free-carrier lifetimes. Free-carrier lifetimes are greatly affected by the type and concentration of crystalline defects incorporated during the growth process, and thus can be affected by many subtle changes in growth conditions and reactor design. Several of the system 200 design features illustrated in FIG. 6 are distinct from those of the more common open-tube HVPE reactor designs used in the prior art (such as Lynch, C., et al. "Thick orientation-patterned GaAs grown by low-pressure HVPE on fusion-bonded templates." *Journal of Crystal Growth*, Volume 353, Issue 1(2012) pages 152-157).

Several exemplary aspects of the system 200 serve to minimize contamination from impurities that act as traps to reduce the free carrier lifetime in GaAs. In one particular embodiment, system 200 isolates the flow of the precursor gases so that mixing and reaction of the GaCl and $AsH_3$, only occurs at the substrate wafer 212 surface. This is distinct from conventional designs which allow mixing of the precursor gases well before reaching the substrate surface (up to 1 meter). As a result, these prior designs (such as Lynch et. al.) are plagued by parasitic deposition of GaAs on the walls of the reactor rather than primarily on the substrate itself. As the growth run progresses in these prior designs, more and more of the GaAs growth occurs on the reactor walls rather than on the substrate. Consequently the growth rate on the wafer decreases over time (eventually dropping to zero), resulting in longer growth times to achieve a given layer thickness which increases the likelihood that lifetime-killing impurities and defects will be incorporated during the run. The close-coupled showerhead apparatus 210 and the horizontally flowing sheet of $AsH_3$ defined by the slot in endcap 220 of system 200, which introduces the reactant gases directly at the wafer surface, greatly reduces parasitic GaAs growth and maintains a high constant GaAs growth rate on the wafer which minimizes process time and defect incorporation and thereby maximizes carrier lifetime.

Some additional background is further provided of conventional HVPE systems utilized to grow GaAs. Some conventional HVPE systems utilize an open tube reactor design which can be plagued by parasitic growth on the sidewalls of the tube reactor. The parasitic growth on the reactor sidewall reduces growth rates in the conventional systems which results in longer runs. The longer run time increases contamination in the grown GaAs products, and the contamination reduces free carrier lifetimes. To combat the parasitic growth along the hot sidewalls of the reactor, some conventional HVPE systems add HCl along the hot sidewalls. However, HCl along the sidewalls attacks fused silica sidewalls which results in Silicon and Oxygen contamination in the GaAs product which decreases free carrier lifetimes. Furthermore, conventional HVPE systems often use a dishrack-style wafer geometry that reduces the growth rate on the desired front face since it allows growth on the back side of the substrate as well. Furthermore, the dishrack-style wafer geometry may also lead to contamination from the back side of the substrate, particularly in the case of foreign substrates such as Ge. These negative aspects of the dish-rack geometry are eliminated in the system 200 design of FIG-6, since here the substrate wafer 212 is horizontal and sits in a slightly recessed wafer holder which eliminates back-side growth as well as backside contamination by vapor transport.

Another exemplary growth condition of system 200 is the use of a substrate wafer 212 (such as GaAs) with a crystallographic orientation that is "off-cut" (typically 2 to 6 degrees) relative to the principal crystallographic axis. The polished surface of an epitaxial-ready GaAs semiconductor wafer will be nearly atomically smooth, and growth will occur in a direction normal to the wafer surface at a reduced rate, as in the prior art (Lynch et. al.). The surface of an "off-cut" wafer, however, will be characterized by atomic layer steps (occurring at greater frequency with increasing off-cut angle), and these step edges act as nucleation sites for lateral "step-flow" growth across the wafer surface: the resulting growth rate increases by a factor of 2 to 4 for 2-degree and 4-degree off-cut angles respectively, consequently reducing growth time and defect incorporation. In one embodiment, the wafer 212 is an off-cut semiconductor substrate wafer defining an off-cut angle relative to the primary crystallographic plane that is tilted between 1° and 10° toward a crystallographic direction.

Refernce is now made to system 200 and its distinctions from the conventional HVPE system discussed above. System 200 provides a close-coupled shower-head apparatus 210 as part of the reactor. This close-coupled shower-head reactor replaces the open tube reactor of the conventional HVPE systems discussed above. The close-coupled shower-head apparatus 210 enables the As and Ga to orthogonally mix directly at the wafer 212 surface to thereby minimize GaAs growth time. By minimizing growth time, system 200 minimizes contamination in the GaAs. When the GaAs is free from contamination (i.e., more pure), then the free carrier lifetimes of the resultant GaAs are increased.

Some additional features of system 200 increase the growth rate which reduces the overall growth time. For example, it has been found that the off-cut wafer 212 increases the growth rate of the GaAs products. This reduces overall growth time, which minimizes contamination, to thereby increase free carrier lifetimes.

In one embodiment, system 200 does not have any HCl flowing along the hot sidewalls of the reactor. This minimizes etching and release of Si and O contaminants from the fused silica ($SiO_2$) sidewalls, which can be incorporated in the growing GaAs as impurities that reduce carrier lifetimes. Furthermore, system 200 in one example includes pyrolytic boron nitride (PBN) injectors, a PBN wafer holder 213 beneath the substrate wafer 212 which covers the rotating satellite disc 215, as well as PBN covers on the susceptor 208, which cover or replace $SiO_2$ in the reaction zone. The minimization of exposed $SiO_2$ in the reaction zone (via the use of PBN) helps to establish long free carrier lifetimes through the reduction of Si and O impurities.

In another embodiment, system 200 may include a horizontal wafer geometry and a recessed wafer holder 213 that substantially eliminates back-side growth and impurity vapor transport from the substrate.

It has been determined that system 200 is able to produce GaAs having free carrier lifetimes of at least 10 microseconds or more. This is significantly greater than conventional LP-HVPE systems discussed above. The method of producing GaAs from system 200 is accomplished by some of the following steps. For example, one method of forming bulk GaAs having a carrier lifetime of at least 10 microseconds in system 200 may include providing a low-pressure hydride vapor epitaxy (HVPE) system 200 including a reaction chamber 202; providing an arsine source 204; providing a gallium chloride source 206; delivering arsine (AsH3) from the arsine source 204 to a substrate 212 inside the reaction chamber 202; delivering gallium chloride (GaCl) from the gallium chloride source 206 to the substrate 212; and mixing and effecting the reaction of the gallium chloride with the arsine directly at the substrate 212 surface to create GaAs having a carrier lifetime of at least 10 microseconds. Further to this exemplary method, the mixing and effecting the reaction of the gallium chloride with the arsine directly at the substrate wafer 212 surface may be accomplished by a close-coupled shower-head apparatus 210 delivering gallium chloride (GaCl) vertically to react with a horizontal flowing sheet of AsH3 222 to mix, react, and deposit GaAs directly at the substrate wafer 212 surface. This exemplary method may further include growing bulk GaAs to a thickness greater than 500 micrometers. This exemplary method may further include the use of a GaAs substrate with an orientation that is off-cut from the principal axis at an off-cut angle ranging from 1° to 10°. In one particular embodiment, the off-cut angle is about 4°.

Figure 7:
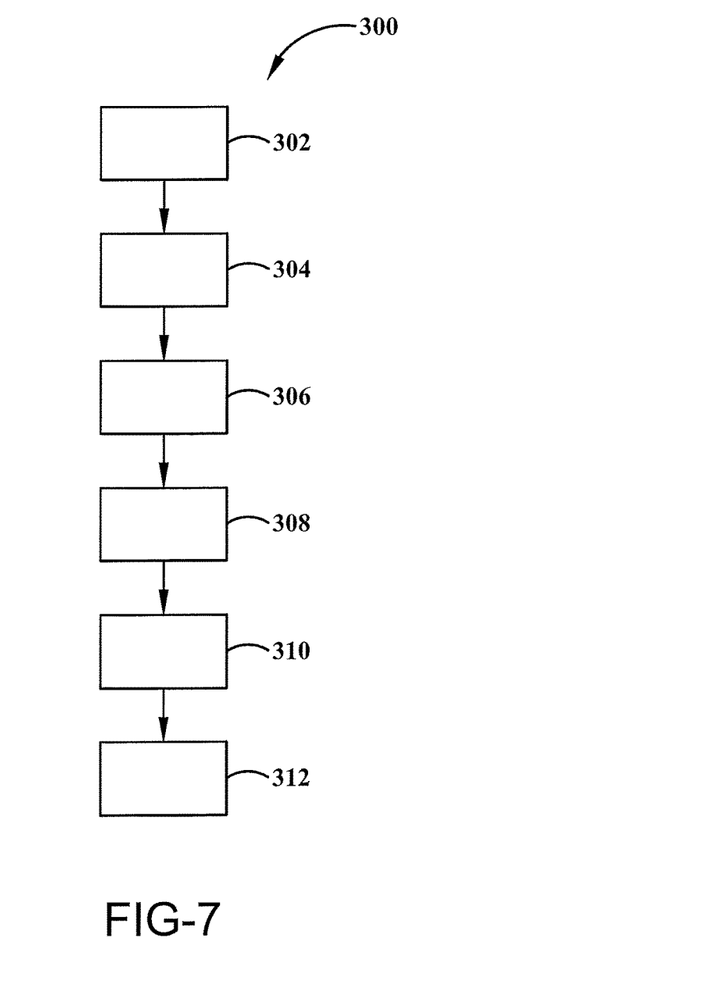
FIG. 7 is an exemplary flow chart of a method of forming bulk GaAs having long free carrier lifetimes in accordance with the present disclosure.

FIG. 7 depicts an exemplary method 300 of forming bulk GaAs having a carrier lifetime of at least 10 microseconds in system 200 that may include providing a low-pressure hydride vapor epitaxy (HVPE) system 200 including a reaction chamber 202, shown generally at 302; providing an arsine source 204, shown generally at 304; providing a gallium chloride source 206, shown generally at 306; delivering arsine ($AsH_3$) from the arsine source 204 to a substrate 212 inside the reaction chamber 202, shown generally at 308; delivering gallium chloride (GaCl) from the gallium chloride source 206 to the substrate 212, shown generally at 310; and mixing and effecting the reaction of the gallium chloride with the arsine directly at the substrate 212 surface to create GaAs having a carrier lifetime of at least 10 microseconds, shown generally at 312.

Further to this exemplary method, the mixing and effecting the reaction of the gallium chloride with the arsine directly at the substrate/wafer 212 surface may be accomplished by a close-coupled shower-head apparatus 210 delivering gallium chloride (GaCl) vertically to react with a horizontally flowing sheet of $AsH_3$ 222 in or to mix, react, and deposit GaAs directly at the substrate wafer 212 surface. This exemplary method may further include growing bulk GaAs to a thickness greater than 500 micrometers. This exemplary method may further include the use of a GaAs substrate with an orientation that is off-cut form the principal axis at an off-cut angle ranging from 1° to 10°. In one particular embodiment, the off-cut angle is about 4°.

The exemplary method may further include precluding the growth of GaAs parasitics on the chamber walls of the low pressure HVPE system through direct delivery of arsine and gallium chloride to the substrate/wafer 212 surface in a close-couple shower-head apparatus 210. As used herein, direct delivery refers to the delivery of the gallium chloride gas directed to the surface of the wafer and substantially orthogonal to the wafer surface. At the same time, the arsine gas is delivered substantially parallel to the wafer surface and substantially orthogonal to the delivered gallium chloride. The arsine is injected as a flowing "sheet" of gas from a horizontal slot (approximately the width of the satellite disc), the bottom of which is aligned with the top surface of the substrate wafer. The close coupled delivery as used herein refers to the point at which the two reactants (GaCl and $AsH_3$) are first allowed to mix and react: $AsH_3$ flows in intimate contact with the wafer surface, and the GaCl is injected from a "shower head" directly above the wafer surface at a distance between 5 and 15 mm. (This separation distance depends upon the required thickness of the final device: 5 mm is adequate for most devices <3 mm thick, but 15 mm will be needed to grow 10-12 mm thick devices.) Furthermore, it would be possible for the $AsH_3$ to be injected through the close-couple showerhead apparatus and the GaCl to flow through the slot formed in the endcap.

This exemplary method may further include precluding the flow of hydrogen chloride (HCl) along the chamber walls of the low pressure HVPE system 200 in order to minimize the liberation of Silicon (Si) and Oxygen (O) contaminants from the $SiO_2$ reactor walls that could be incorporated as impurities in the growing GaAs layer and reduce the free carrier lifetimes. This exemplary method may further include the use of Pyrolytic Boron Nitride (PBN) components to cover or replace Silicon Dioxide ($SiO_2$) components in the reaction zone of chamber 202 of the low pressure HVPE system 200 in order to further reduce Si and O contamination. The use of PBN in the main reaction zone of the chamber 202 may include replacing $SiO_2$ with PBN as the material used for the injector 210. This exemplary method may further include covering the susceptor 208 in the chamber 202. This exemplary method may further include replacing $SiO_2$ with PBN as the material used for the rotating wafer holder 213. This exemplary method may further include a wafer holder 213 which is recessed, wherein the recessed horizontal wafer 212 may reduce back-side growth and impurity vapor transport from the back-side of the substrate wafer.

The exemplary method may further include a bulk GaAs product having a carrier lifetime of at least 10 microseconds wherein the bulk GaAs product is grown in a low pressure hydride vapor phase epitaxy system and prepared by a process comprising the steps of: providing an arsine source; providing a gallium chloride source; providing a substrate having a growth surface; delivering arsine from the arsine source to the substrate in a direction parallel to the growth surface; delivering gallium chloride from the gallium chloride source to the substrate in a direction perpendicular to the growth source; and mixing and effecting the reaction of the gallium chloride with the arsine directly at the growth surface.

In the foregoing description, certain terms where used for brevity, clearness, and understanding. No unnecessary limitations are to be implied therefrom beyond the requirement of the prior art because such terms are used for descriptive purposes and are intended to be broadly construed. Therefore, the disclosure is not limited to the specific details, the representative embodiments, and illustrative examples shown and described. Thus, this application is intended to embrace alterations, modifications, and variations that fall within the scope of the appended claims.

Moreover, the description and illustration of the present disclosure is an example and the disclosure is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, but it can.

What is claimed is:

1. A method of forming bulk gallium arsenide (GaAs) having a carrier lifetime of at least 10 microseconds comprising:
    providing a low-pressure hydride vapor epitaxy (HVPE) system including a reaction chamber;
    providing an arsine source;
    providing a gallium chloride source;
    delivering arsine (AsH3) from the arsine source to a substrate inside the reaction chamber;
    delivering gallium chloride (GaCl) from the gallium chloride source to the substrate;
    delivering AsH3 orthogonally relative to the GaCl directly at the substrate surface; and
    mixing and effecting a reaction of the gallium chloride with the arsine directly at the substrate surface to create bulk GaAs having a carrier lifetime of at least 10 microseconds.

2. The method of claim 1, wherein mixing and effecting the reaction of the gallium chloride with the arsine directly at the substrate surface is accomplished by a close-coupled shower-head apparatus delivering the gallium chloride to mix with arsine flowing across the wafer surface.

3. The method of claim 1, further comprising:
    growing bulk GaAs to a thickness greater than 500 micrometers.

4. The method of claim 1, wherein the substrate is an off-cut semiconductor substrate wafer, wherein an off-cut angle, relative to a primary crystallographic axis is greater than 1°.

5. The method of claim 4, wherein the off-cut angle is in a range from 1° to 10°.

6. The method of claim 5, wherein the off-cut angle is about 4°.

7. The method of claim 1, further comprising:
    precluding growth of parasitic Gallium Arsenide (GaAs) deposits on chamber walls of the low pressure HVPE system through direct delivery of gallium chloride via a close-coupled shower-head apparatus to react with arsine flowing across the wafer surface.

8. The method of claim 1, further comprising:
    minimizing the incorporation of Silicon (Si) and Oxygen (O) impurities to effectuate the long carrier lifetimes.

9. The method of claim 8, further comprising:
    precluding flow of hydrogen chloride (HCl) along silicon dioxide ($SiO_2$) chamber walls of the low pressure HVPE system.

10. The method of claim 8, further comprising:
    replacing silicon dioxide ($SiO_2$) with Pyrolytic Boron Nitride (PBN) in a main reaction zone of the reaction chamber of the low pressure HVPE system.

11. The method of claim 10, wherein a shower-head apparatus delivering the gallium chloride to react with arsine at the substrate surface is fabricated from PBN.

12. The method of claim 10, wherein a susceptor is covered by PBN.

13. The method of claim 10, further comprising:
    rotating a satellite disc that supports a wafer holder and wafer from below, wherein the wafer holder is fabricated from PBN.

14. The method of claim 1, further comprising providing a recessed horizontal wafer holder.

15. The method of claim 14, wherein the recessed horizontal wafer holder reduces back-side impurity vapor transport from the substrate.

16. The method of claim 1, further comprising:
    rotating the substrate, wherein the substrate is rotated during GaAs growth.

17. The method of claim 16, wherein the wafer is rotated to enhance mixing of the reacting GaCl and $AsH_3$ gases.

18. The method of claim 16, wherein the wafer is rotated to achieve bulk GaAs with uniform composition and thickness.

19. The method of claim 16, wherein the wafer is rotated by flowing inert gas over grooves on the underside of the satellite disc that supports the wafer.

* * * * *